United States Patent
Ikeda et al.

(10) Patent No.: US 6,479,306 B1
(45) Date of Patent: Nov. 12, 2002

(54) METHOD FOR MANUFACTURING SEMICONDUCTOR DEVICE

(75) Inventors: Kouichi Ikeda, Jouetsu (JP); Takeshi Ikeda, Jouetsu (JP)

(73) Assignee: Niigata Seimitsu Co., Ltd., Jouetsu (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/716,165

(22) Filed: Nov. 17, 2000

Related U.S. Application Data

(63) Continuation of application No. PCT/JP99/02564, filed on May 18, 1999, and a continuation of application No. PCT/JP99/02565, filed on May 18, 1999.

(30) Foreign Application Priority Data

May 19, 1998 (JP) ............................. 10-153818
May 19, 1998 (JP) ............................. 10-153819

(51) Int. Cl.$^7$ ............................................. G01R 31/26
(52) U.S. Cl. ............................ 438/14; 438/15; 438/417
(58) Field of Search ....................... 438/14, 15, 417; 257/737

(56) References Cited

U.S. PATENT DOCUMENTS

| | | | | |
|---|---|---|---|---|
| 5,391,916 A | * | 2/1995 | Kohmo et al. | 257/676 |
| 6,281,026 B1 | * | 8/2001 | Ikeda et al. | 438/14 |
| 6,291,309 B1 | * | 9/2001 | Ikeda et al. | 438/417 |

FOREIGN PATENT DOCUMENTS

| | | |
|---|---|---|
| JP | 49-355860 | 9/1974 |
| JP | 6-334034 | 12/1994 |
| JP | 9-199450 | 7/1997 |

* cited by examiner

*Primary Examiner*—Hoai Ho
*Assistant Examiner*—Thao P Le
(74) *Attorney, Agent, or Firm*—Dellett and Walters

(57) ABSTRACT

A semiconductor device and a method for manufacturing the semiconductor device mountable with high density, which includes a simplified process but is capable of reducing a defect rate. A plurality of semiconductor chips of different kinds (processor chip and memory chip) are formed on a semiconductor wafer, and a go/no-go test is conducted on all the chips. The semiconductor wafer is cut and divided into pieces that each consist of a good processor chip and a good memory chip, and they are mounted on a substrate to form a semiconductor module.

2 Claims, 5 Drawing Sheets

US 6,479,306 B1

METHOD FOR MANUFACTURING SEMICONDUCTOR DEVICE

This Appln is a cont of PCT/JP99/02564 filed May 18, 1999 and a cont of PCT/JP99/02565 filed May 18, 1999.

TECHNICAL FIELD

The invention relates to a semiconductor device mounted on a memory substrate, a mother board, or the like and a method for manufacturing the same.

BACKGROUND ART

A semiconductor chip such as a memory chip cut out from a semiconductor wafer is generally mounted on a printed substrate or the like in a packaging condition. However, an outer size of a package is considerably larger than the size of a various types of the semiconductor chips themselves and therefore, there is a certain limit in the number of the packages mountable on the printed substrate or the like.

On the other hand, recently, a multichip module (MCM), in which a plurality of semiconductor chips are mounted on the substrate, is being popularized. Using the multichip module allows the followings: (1) miniaturization of a mounting area and weight reduction accompanying with this, (2) realization of a high performance and high speed by high density wiring and bear chip mounting, and (3) keeping high reliability.

By the way, in the multichip module capable of a high density mounting described above, a plurality of semiconductor chips are mounted on a single substrate and therefore, a defect ratio of respective semiconductor chip is accumulated to make a total defect ratio of the module large. For example, in the case where two semiconductor chips are implemented on a single module substrate, only one defect semiconductor chip causes overall defect of the module. Therefore, it is necessary handling to replace the defect semiconductor chip as a repairing work and discard the overall module as a defect product. Thus, a low yield and a low efficiency occur. In addition, in the case where a plurality of semiconductor chips are mounted on a single substrate, each one of respective chips is mounted on a single substrate to complicate a manufacturing process.

DISCLOSURE OF THE INVENTION

The present invention is achieved in consideration of such points and an object thereof is to provide a semiconductor device and a method for manufacturing thereof capable of reducing a defect ratio in manufacturing the semiconductor device mountable with high density and capable of simplifying the process.

In the present invention, after a plurality of different kinds of semiconductor chips are formed on the semiconductor wafer or after wiring, resin sealing, and terminal formation is carried out for these semiconductor chips, a go/no-go test (quality test) is conducted for each semiconductor chip. According to the result, a unit of predetermined of a plurality of semiconductor chips is divided to form the semiconductor device. Dividing semiconductor chips is carried out according to the result of quality test. When the semiconductor device comprising a plurality of semiconductor chips is manufactured, some defective semiconductor chips among them does not cause defect of overall semiconductor device. Thus, the defect rate in manufacturing the semiconductor device can be reduced. Because the semiconductor device comprising a plurality of semiconductor chips can be used in a process thereafter and thus, in comparison with application of combination of a plurality of semiconductor devices comprising a single semiconductor chip, the process thereafter can be simplified.

Particularly, by practice of a mounting step composed of wiring, resin sealing, and terminal formation for respective semiconductor chips formed on the semiconductor wafer, in comparison with the case where the mounting step is carried out after respective semiconductor chips are individually divided more simplification of the process become possible.

BEST MODE FOR CARRYING OUT THE INVENTION

A semiconductor device of a first embodiment according to the present invention will be described below with reference to drawings. FIGS. 1A to 1D are diagrams showing a manufacturing process of a semiconductor device of a first embodiment.

Figure 1A:
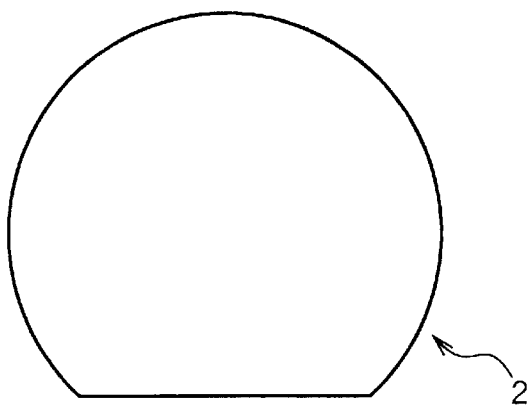
FIGS. 1A to 1D are diagrams showing a manufacturing process of a semiconductor module of a first embodiment.
Figure 1B:
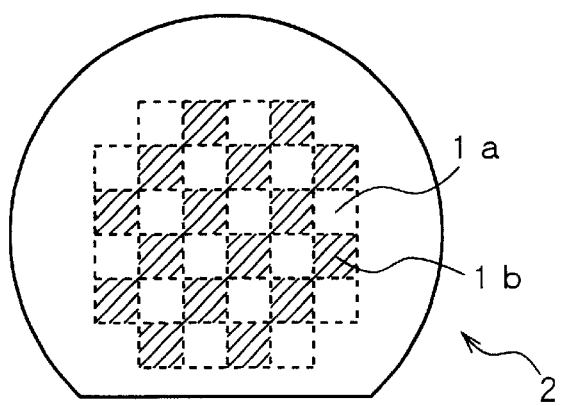

First, as shown in FIGS. 1A and 1B, a semiconductor wafer 2 which is, for example, a flake of silicon monocrystal, is introduced to form two kinds of semiconductor chips 1 thereon (a first step). For example, one of two kinds of semiconductor chips 1 is assigned to a processor chip 1a and the other is assigned to the memory chip 1b. A vacant area surrounded by a dotted line in FIG. 1B shows the processor chip 1a and an area denoted by oblique lines shows the memory chip 1b. As shown in FIG. 1B, in forming a plurality of semiconductor chips 1 on the semiconductor wafer 2, the processor chip 1a and the memory chip 1b are arranged in the state of abutting each other in all four edges.

Figure 2:
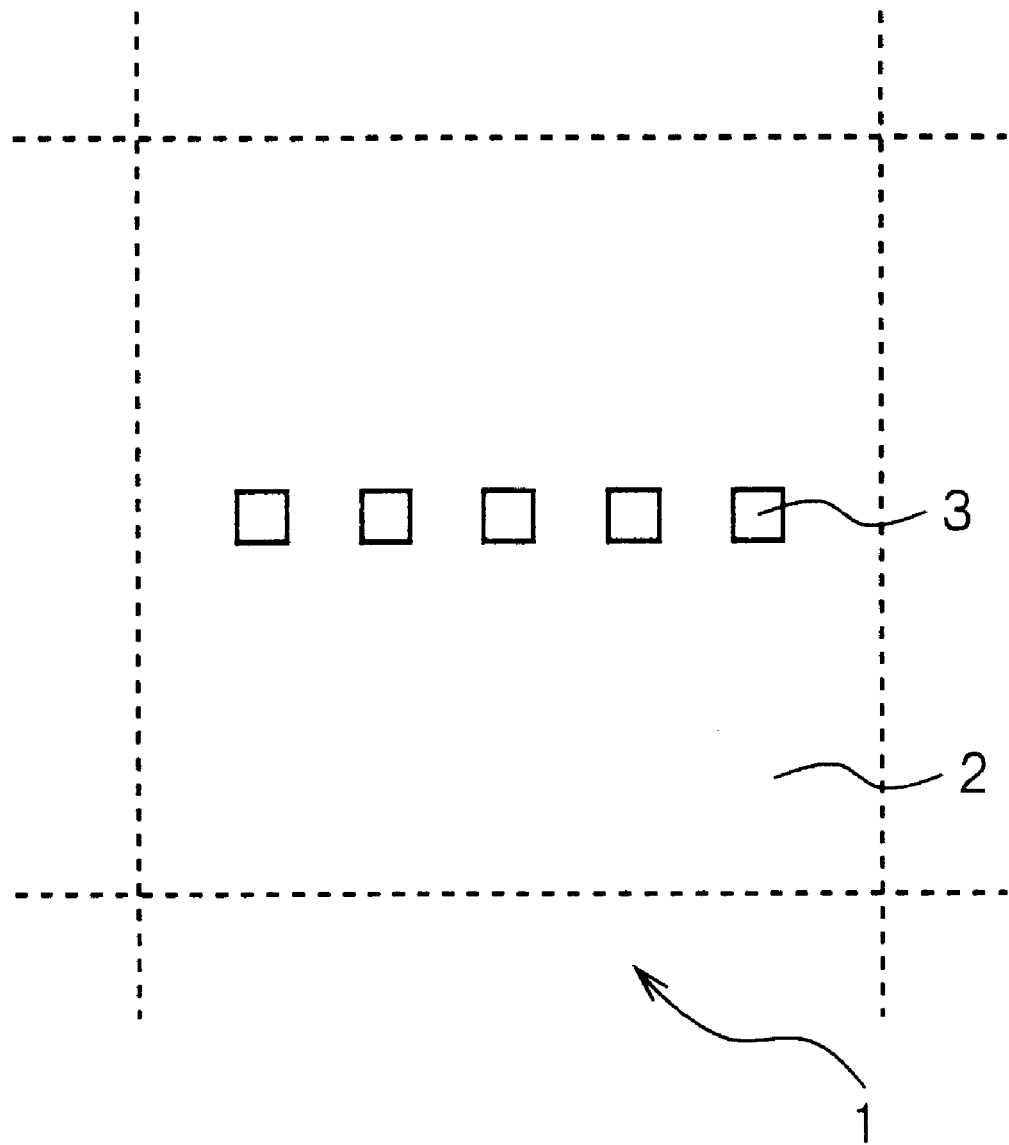
FIG. 2 is a diagram showing an outline of a semiconductor chip formed on a semiconductor wafer.

FIG. 2 is a diagram showing an outline of the semiconductor chip 1 formed on the semiconductor wafer 2. As shown in FIG. 2, the semiconductor chip 1 is configured by including the semiconductor wafer 2 with a predetermined size and a plurality of chip pad (pad for the chip) s 3 formed on the surface of the semiconductor wafer 2. The chip pad 3 is a connecting terminal to carry out an electric connection to the substrate on which the semiconductor chip 1 is mounted. In FIG. 2, the case, where the chip pad 3 is formed in around a center of the semiconductor chip 1 to make a row, is shown. However, a number and position of arrangement of the chip pad 3 is suitably changed according to a kind of the semiconductor chip 1.

In a status in which a plurality of semiconductor chips 1 have been formed on the semiconductor wafer 2 in such manner, then each of semiconductor chips 1 is subjected to quality test (a second step). For example, to the chip pad 3 formed on each semiconductor chip 1, a test probe is pressed to be electrically contacted for carrying out various function tests. By carrying out the quality test of each semiconductor chip 1 for a unit of a whole the semiconductor wafer 2, in other words, by the quality test of a plurality of semiconductor chips 1 formed on the semiconductor wafer 2 carried out at once, test efficiency is realized.

Figure 1C:
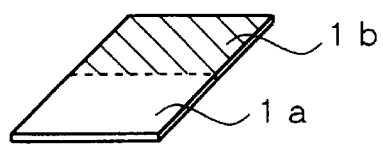

Next, on the basis of a result of the quality test in the second step, as shown in FIG. 1C, respective semiconductor chips 1 determined as good are divided into two chips, in combination of one processor chip 1a with one adjacent memory chip 1b, as one set (a third step).

Figure 3A:
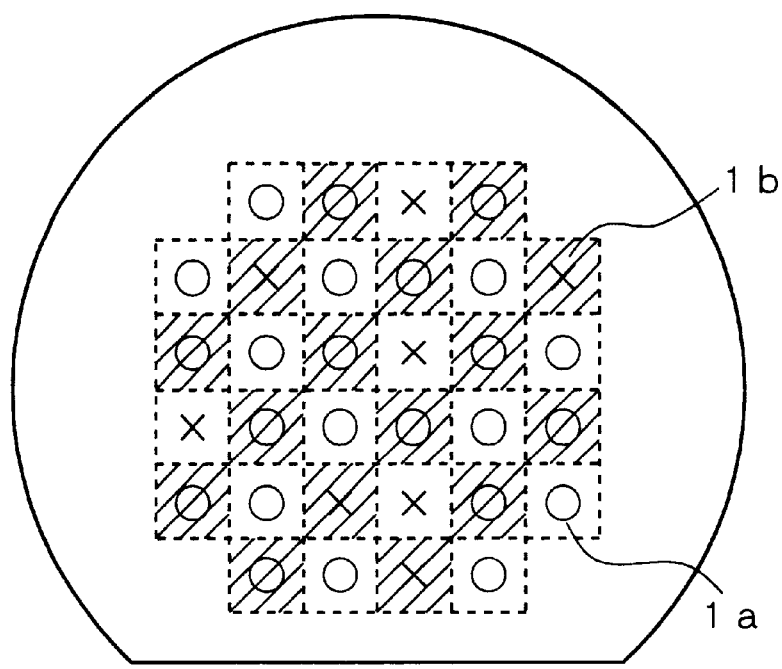
FIGS. 3A and 3B are diagrams showing an example of dividing method for the semiconductor chip formed on the semiconductor wafer.
Figure 3B:
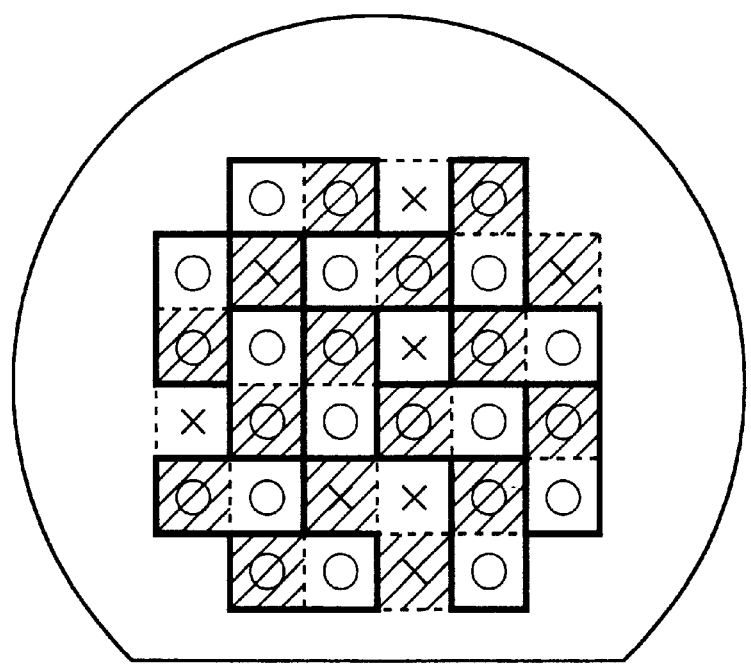

FIGS. 3A and 3B are diagrams showing an example of dividing method for a plurality of semiconductor chips 1 formed on the semiconductor wafer 2. FIG. 3A is a diagram showing the result of the quality test of each semiconductor chip 1 in the second step as described above. Circled and crossing marks denote semiconductor chips 1 determined good and semiconductor chips 1 determined bad, respectively. FIG. 3B is a diagram showing how to divide semiconductor chips 1 determined good in FIG. 3A. An area surrounded by a solid line shows a unit of dividing. As described above, the semiconductor chips 1 are divided in combination of one processor chip 1a with one memory chip 1b. Therefore, as shown in FIG. 3B, by dividing in consideration of combination of the processor chip 1a with the adjacent memory chip 1b, of which both have been determined good in quality, the semiconductor device is fabricated in the status of connecting the processor chip 1a with the memory chip 1b.

Figure 1D:
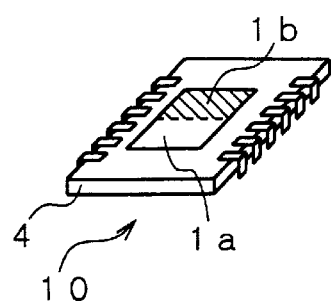

Next, as shown in FIG. 1D, the processor chip 1a and the memory chip 1b which are divided are mounted on the substrate 4 to complete finally a semiconductor module 10a (a fourth step). For example, as a method of mounting on the substrate 4, the chip pad 3, which is formed on the semiconductor chip 1, is connected to an electrode (not illustrated) formed on the substrate 4 by using a bonding wire.

As described above, two kinds of a plurality of semiconductor chip 1 on the semiconductor wafer 2 is formed, then the quality test is executed. Among respective semiconductor chips 1 formed on the semiconductor wafer 2, those only determined as good are divided in the state of combination to fabricate the semiconductor module 10 and thus, it does not take place that a part of defective semiconductor chips 1 contained in the semiconductor module 10 makes whole of the semiconductor module 10 defective. Therefore, defect ratio can be reduced in fabrication of the semiconductor module 10.

Particularly, in the present embodiment, division is performed in the status of connecting the processor chip 1a with the memory chip 1b. Combination of the processor chip 1a with the adjacent memory chip 1b can be freely determined on the basis of the result of quality test. Therefore, respective processor chips 1a can be combined with adjacent memory chips, even if one adjacent memory chip 1b is defective. Similarly, respective memory chips 1b can be combined with adjacent other processor chips 1a, even if one adjacent processor chip 1a is defective. Therefore, in consideration of combination of the processor chip 1a with the memory chip 1b, more semiconductor devices, which are a combination of two semiconductor chips 1, can be fabricated from one semiconductor wafer 2.

Furthermore, the semiconductor module 10 is mounted by the divided combination of processor chip 1a and memory chip 1b formed on the semiconductor wafer 2. In other words, a plurality of semiconductor chip 1 are mounted in the status of connecting each other. Therefore, in comparison with the case where an each individual processor chip 1a and memory chip 1b is divided from the semiconductor wafer 2 one by one to mount with a distance from each other resulting in formation of the semiconductor module, miniaturization of components can be realized by high density mounting. Also, mounting of a plurality of semiconductor chips 1 at once can be carried out and thus, fabrication process can be simplified.

Next, the semiconductor module of a second embodiment by an application of the present invention will be subsequently described. The semiconductor module according to the present embodiment is fabricated by a chip size package mounting technique (CSP). FIGS. 4A to 4D are diagrams showing the fabrication procedure of the semiconductor module according to the present embodiment.

Figure 4A:
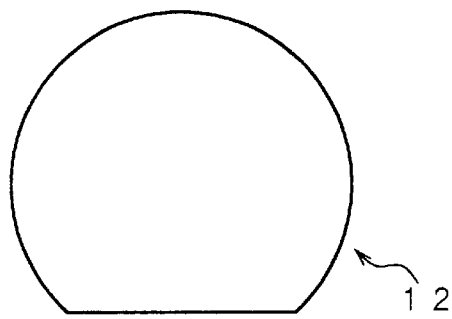
FIGS. 4A to 4D are diagrams showing the manufacturing process of the semiconductor module of a second embodiment.
Figure 4B:
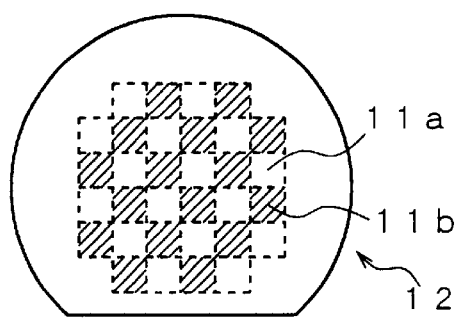
Figure 4C:
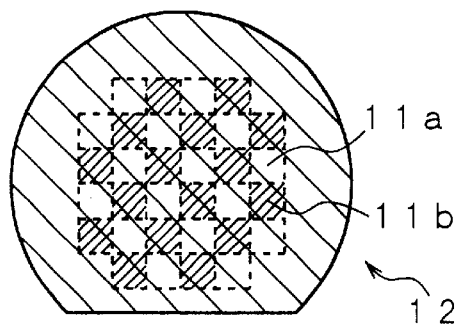

First, as shown in FIGS. 4A and 4B, the semiconductor wafer 12 is introduced to form a plurality of semiconductor chips 11 (for example, processor chip 11a and memory chip 11b) on this semiconductor wafer 12 (the first step). In FIG. 4B, the vacant regions surrounded with a dotted line show processor chips 11a and the regions denoted by an oblique line show memory chips 11b. In forming a plurality of semiconductor chip 11 on the semiconductor wafer 12, the processor chip 11a and memory chip 11b are arranged in the state of abutting each other in all four edges. Next, for a whole of the semiconductor wafer 12 in the status of forming a plurality of semiconductor chip 11, as shown in FIG. 4C, after conducting wiring and resin sealing, CSP mounting is carried out to form the terminal (the second step).

Figure 5:
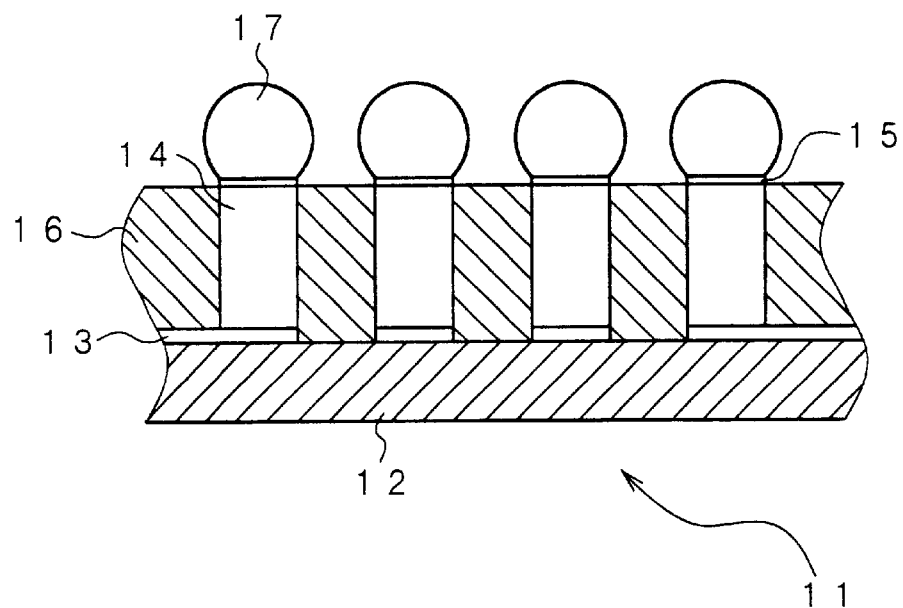
FIG. 5 is an enlarged sectional view of the semiconductor chip mounted by CSP.

FIG. 5 is an enlarged sectional view of the semiconductor chip 11 mounted by CSP. As shown in FIG. 5, the semiconductor chip 11 mounted by CSP is configured by including the semiconductor wafer 12, a wiring pattern 13, a via post 14, barrier metal 15, a resin layer 16, and a solder ball 17.

The wiring pattern 13 is formed by processing a metal thin film, which has been formed on a surface of the semiconductor wafer 12, by using a resist followed by electrolytic plating processing. The via post 14 is connected to the wiring pattern 13 and the barrier metal 15 is formed on top thereof. The resin layer 16 seals the surface of the semiconductor wafer 12. The resin layer 16 has a thickness almost equal to a height of the via post 14 and is formed to allow the barrier metal 15 to expose to outside in resin sealing. The solder ball 17 is a connection terminal to electrically connect the substrate for mounting of the semiconductor chip 11.

In the status in which according to such a manner, a plurality of semiconductor chips 11 formed on the semiconductor wafer 12 have been mounted by CSP, then quality test is conducted for respective semiconductor chips 11 (the third step). For example, by pressing a test probe to the solder ball 17 formed corresponding to respective semiconductor chips 11 to electrically contact, various function tests are conducted. Quality test of the semiconductor chip 11 is conducted for whole semiconductor wafer 12 as a unit, in other words, quality test of a plurality of semiconductor chips 11 formed on the semiconductor wafer 12 is conducted at once and hence, efficiency of the test is improved.

Figure 4D:
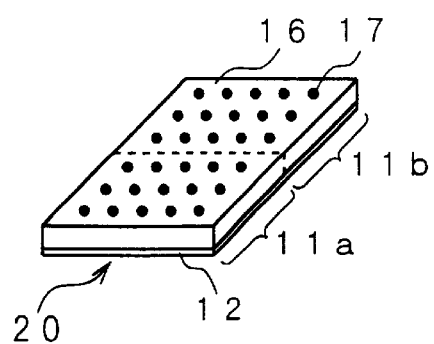

Subsequently, on the basis of a result of quality test in the third step, as shown in FIG. 4D, semiconductor chips 11, which have been mounted by CSP and determined as good, are divided as the semiconductor device which is a combination of a processor chip 11a with memory chip 11b and then, finally, either the semiconductor module 20 is completed (a fourth step). Concretely, the dividing method shown in FIG. 3 applied to the first embodiment described above is adopted.

As described above, after forming a plurality of different semiconductor chip 11 on the semiconductor wafer 12, the CSP mounting is carried out. Among respective semiconductor chips 11 mounted by CSP, those only determined as good by a quality test are divided to fabricate the semiconductor module 20 as the semiconductor device and thus, it does not take place that only one of two semiconductor chips 11 (processor chip 11a or memory chip 11b) contained in the semiconductor module 20 makes whole of the semiconductor module 20 defective. Therefore, defect ratio can be reduced in fabrication of the semiconductor module 20.

For the semiconductor module 20, those made by dividing from the semiconductor wafer 12 in the combination of a processor chip 11a and a memory chip 11b as one set are mounted. Hence, in comparison with the case, where after dividing each processor chip 11a and memory chip 11b respectively from the semiconductor wafer 12 one by one the semiconductor module is formed by mounting with a distance between them, miniaturization of components can be realized by such high density mounting. Particularly, miniaturization of the mounting area becomes the minimum due to the CSP mounting. On the basis of quality categories, division of the semiconductor chips 11 is performed and thus, the semiconductor module 20 including many semiconductor chips can be efficiently fabricated.

The present invention is not restricted to the above described embodiment and allows various modifications of practice in a range of scope of the present invention. For example, the processor chips 1a and memory chips 1b included the semiconductor wafer 2 according to the above described first embodiment may connect corresponding terminals each other by a wire. For example, a power supply terminal of respective processor chip 1a and memory chip 1b receives a common supply voltage and a clock terminal receives a common operation clock signal respectively. In the case where respective terminals receiving the same voltage or respective terminals used for inputting the same signal are connected each other in formation of respective semiconductor chips 1 to divide into two pieces of semiconductor chips 1 in the condition of connecting, it is adapted to apply the common voltage to or input the common signal in one of the semiconductor chips 1. In this manner, by wiring between each other inside respective semiconductor chips 1, the number of wires between a plurality of semiconductor chips 1 and the substrate 4, on which these chips are mounted, can be reduced to simplify mounting procedure.

Figure 6:
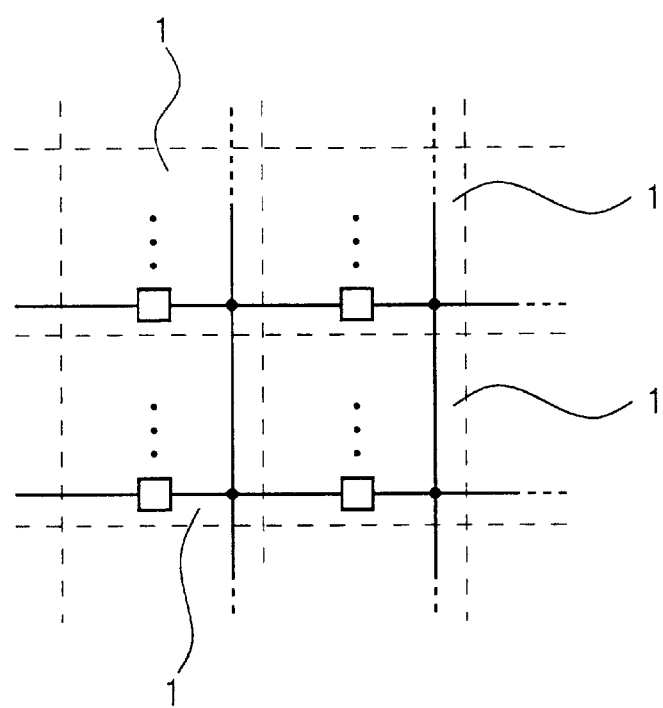
FIG. 6 is a diagram showing a connecting status between respective semiconductor chips connected each other.

However, how to make a combination adjacent respective semiconductor chips 1 to divide can be known until practice of quality test and therefore, as shown in FIG. 6, it is preferable to wire same terminals of all the adjacent semiconductor chips leach other. In addition, the case, where the power supply terminals or the clock terminals are connected each other, has been described as an example. However, other terminals may be connected each other.

In the above described first embodiment, the semiconductor module 10 is formed by mounting a semiconductor device in the state of connecting two semiconductor chips, on the substrate 4. However, it may be adapted to directly mount the semiconductor device composed of two semiconductor chips 1 on a mother board or the like of a personal computer.

In the above described embodiments, the semiconductor device was formed by combining two different kinds of semiconductor chips 1 or 11. More (for example, four) different semiconductor chips 1 may be combined. In this case, all kinds of semiconductor chips do not always differ from each other, but at least two kinds of semiconductor chips are combined. In addition, combination of different kinds of semiconductor chips includes combination of different kinds of memory chips (DRAM and flash memory or the like) and combination of those that are same DRAM with different bit composition and capacity.

Industrial Applicability

As described above, according to the present invention, the unit of predetermined of a plurality of semiconductor chips is divided from the semiconductor wafer according to the result of quality test. Therefore, when the semiconductor device, which comprises a plurality of semiconductor chips and is capable of high density mounting, is fabricated, the following accident does not occur: the whole of the semiconductor device becomes defective caused by defect of a part of semiconductor chips among them and thus, defect ratio can be reduced in fabricating the semiconductor device. Furthermore, the semiconductor device comprising a plurality of semiconductor chips can be used in a post-step and therefore, in comparison with the case where a plurality of semiconductor devices comprising a single semiconductor chip, the post-step can be simplified.

What is claimed is:

1. A method for manufacturing the semiconductor device, comprising:

a first step of forming a plurality of different kinds of semiconductor chips on a semiconductor wafer;

a second step of carrying out a quality test for each of a plurality of said semiconductor chips formed on said semiconductor wafer; and a third step of dividing said semiconductor chips as a unit of predetermined of a plurality pieces on the basis of a result of said quality test.

2. A method for manufacturing the semiconductor device, comprising:

a first step of forming a plurality of different kinds of semiconductor chips on a semiconductor wafer;

a second step of carrying out wiring, resin sealing, terminal formation for a plurality of said semiconductor chips formed on said semiconductor wafer;

a third step of carrying out a quality test of each of a plurality of said semiconductor chips, which is formed on said semiconductor wafer, by using said terminal formed by said second step; and a fourth step of dividing said semiconductor chips as a unit of predetermined of a plurality on the basis of a result of said quality test.

* * * * *